(12) United States Patent
Kim

(10) Patent No.: US 11,594,663 B2
(45) Date of Patent: Feb. 28, 2023

(54) LIGHT EMITTING DIODE DEVICE CONTAINING A MICRO LENS ARRAY AND METHOD OF MAKING THE SAME

(71) Applicant: GLO AB, Lund (SE)

(72) Inventor: Brian Kim, Santa Clara, CA (US)

(73) Assignee: NANOSYS, Inc., Milpitas, CA (US)

( * ) Notice: Subject to any disclaimer, the term of this patent is extended or adjusted under 35 U.S.C. 154(b) by 309 days.

(21) Appl. No.: 16/778,937

(22) Filed: Jan. 31, 2020

(65) Prior Publication Data
US 2021/0193889 A1  Jun. 24, 2021

Related U.S. Application Data

(60) Provisional application No. 62/951,141, filed on Dec. 20, 2019.

(51) Int. Cl.
| | | |
|---|---|---|
| H01L 33/60 | (2010.01) | |
| H01L 27/15 | (2006.01) | |
| G06F 3/041 | (2006.01) | |

(52) U.S. Cl.
CPC ............ H01L 33/60 (2013.01); G06F 3/0412 (2013.01); H01L 27/156 (2013.01)

(58) Field of Classification Search
None
See application file for complete search history.

(56) References Cited

U.S. PATENT DOCUMENTS

| | | |
|---|---|---|
| 7,888,868 B2 | 2/2011 | Kuan et al. |
| 8,309,439 B2 | 11/2012 | Seifert et al. |
| 8,664,636 B2 | 3/2014 | Konsek et al. |
| 8,669,574 B2 | 3/2014 | Konsek et al. |
| 8,956,922 B2 * | 2/2015 | Peil .......... H01L 25/13 438/127 |
| 9,281,442 B2 | 3/2016 | Romano et al. |
| 9,287,443 B2 | 3/2016 | Konsek et al. |
| 9,684,074 B2 | 6/2017 | Schrank et al. |
| 10,177,123 B2 | 1/2019 | Gardner et al. |
| 10,185,150 B2 | 1/2019 | Wang et al. |
| 10,276,764 B2 | 4/2019 | Jansen et al. |
| 10,304,810 B2 | 5/2019 | Gardner et al. |
| 2005/0007000 A1 * | 1/2005 | Chou ............ H05B 33/22 313/116 |
| 2012/0187430 A1 | 7/2012 | West et al. |
| 2013/0193592 A1 | 8/2013 | Peil et al. |
| 2015/0285960 A1 * | 10/2015 | Lee ............ G02B 1/18 359/738 |
| 2016/0306042 A1 | 10/2016 | Schrank et al. |
| 2017/0038028 A1 * | 2/2017 | Cho ............ G02B 27/123 |
| 2017/0068038 A1 | 3/2017 | Danesh et al. |
| 2017/0139105 A1 | 5/2017 | Jansen et al. |
| 2017/0219859 A1 | 8/2017 | Christophy et al. |

(Continued)

FOREIGN PATENT DOCUMENTS

CN    107887523 A   * 4/2018   ......... H01L 27/3246

*Primary Examiner* — Robert K Carpenter

(74) *Attorney, Agent, or Firm* — The Marbury Law Group PLLC

(57) ABSTRACT

A light emitting device includes a backplane, light emitting diodes (LEDs) attached to a front side of the backplane, and a micro lens array (MLA) located over the LEDs, the MLA containing unit lenses that have a smaller maximum diameter than a maximum lateral widths of the respective LEDs.

27 Claims, 13 Drawing Sheets

(56) References Cited

U.S. PATENT DOCUMENTS

| | | |
|---|---|---|
| 2017/0227816 A1 | 8/2017 | Jansen et al. |
| 2017/0309223 A1 | 10/2017 | Deeman et al. |
| 2017/0343186 A1 | 11/2017 | Wang et al. |
| 2017/0373046 A1 | 12/2017 | Gardner et al. |
| 2018/0175262 A1 | 6/2018 | Jansen et al. |
| 2018/0233536 A1 | 8/2018 | Chang |
| 2018/0284534 A1* | 10/2018 | Song ................. G02F 1/133512 |
| 2018/0366450 A1 | 12/2018 | Gardner et al. |
| 2019/0181181 A1* | 6/2019 | Yeon ....................... H01L 33/22 |
| 2019/0310514 A1 | 10/2019 | Kim et al. |
| 2020/0407271 A1* | 12/2020 | Ono ........................ C03C 19/00 |

* cited by examiner

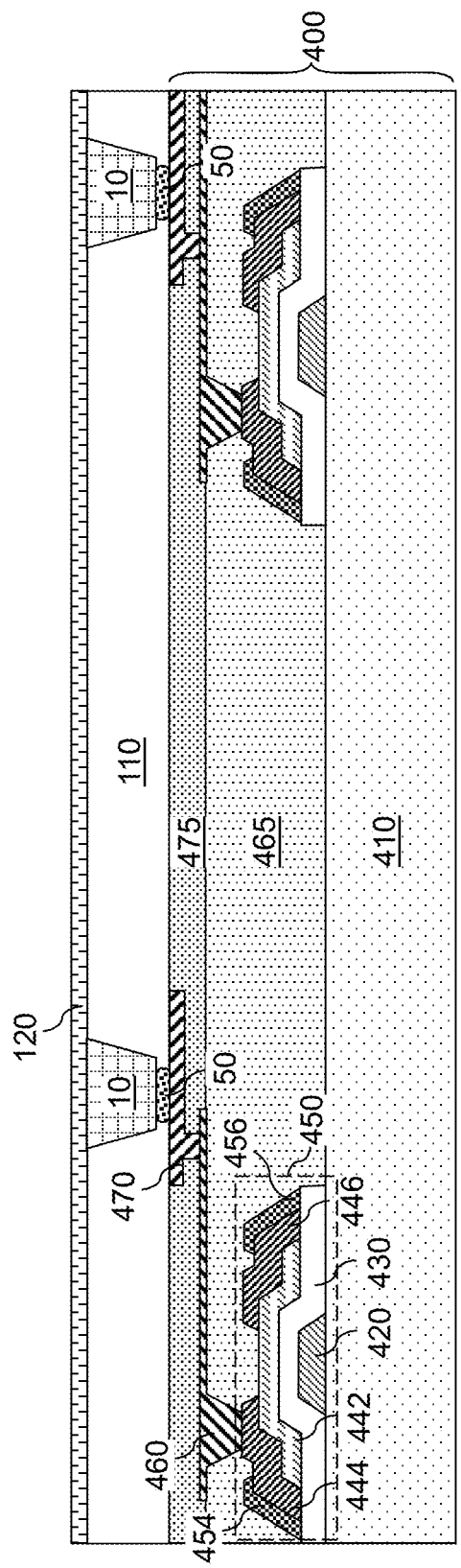

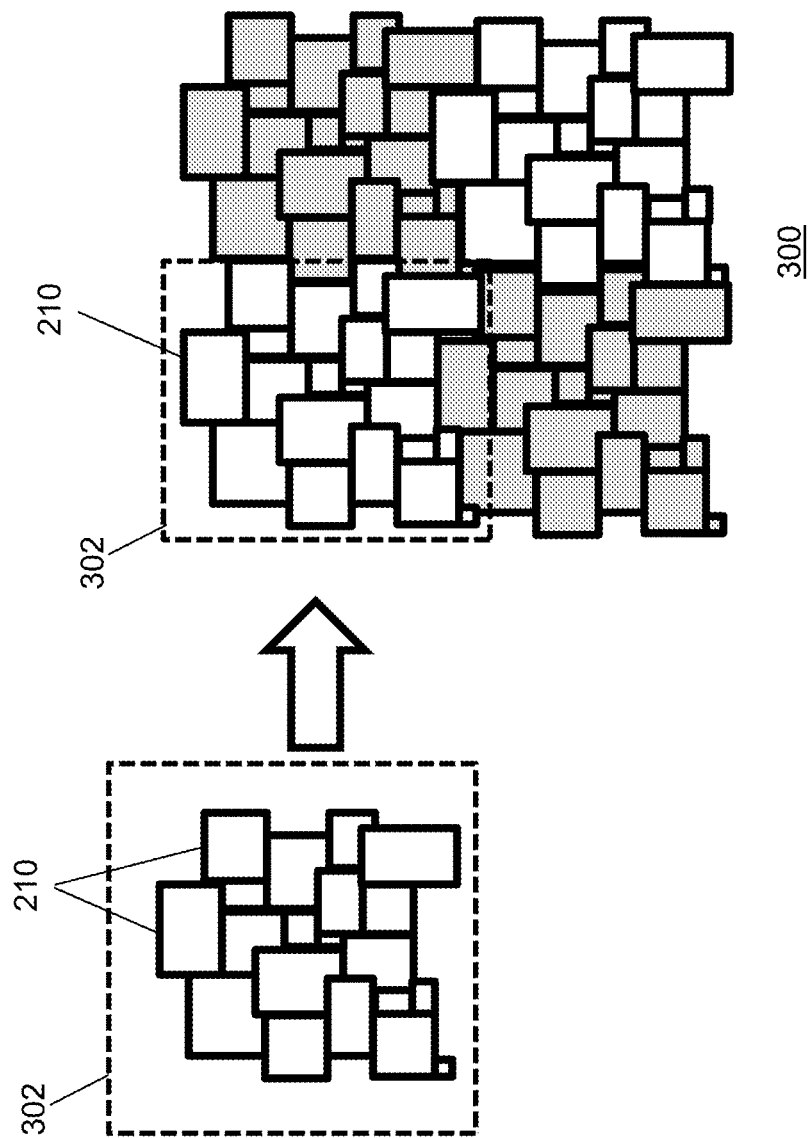

“LIGHT EMITTING DIODE DEVICE CONTAINING A MICRO LENS ARRAY AND METHOD OF MAKING THE SAME”

FIELD

The embodiments of the present disclosure are directed to light emitting devices in general, and to light emitting diode devices with a micro lens array in particular.

BACKGROUND

Light emitting devices such as light emitting diodes (LEDs) are used in electronic displays, such as backlights in liquid crystal displays located in laptops or televisions, and LED billboards and microdisplays. Light emitting devices include light emitting diodes (LEDs) and various other types of electronic devices configured to emit light.

SUMMARY

According to an aspect of the present disclosure, a light emitting device includes a backplane, light emitting diodes (LEDs) attached to a front side of the backplane, and a micro lens array (MLA) located over the LEDs, the MLA containing unit lenses that have a smaller maximum diameter than a maximum lateral widths of the respective LEDs.

BRIEF DESCRIPTION OF THE DRAWINGS

FIG. 3A is a vertical cross-sectional view of the first exemplary structure after formation of a transparent conductive layer according to the first embodiment of the present disclosure.

FIG. 10 is a schematic view of an MLA, according to various embodiments of the present disclosure.

DETAILED DESCRIPTION

Figure 1A:
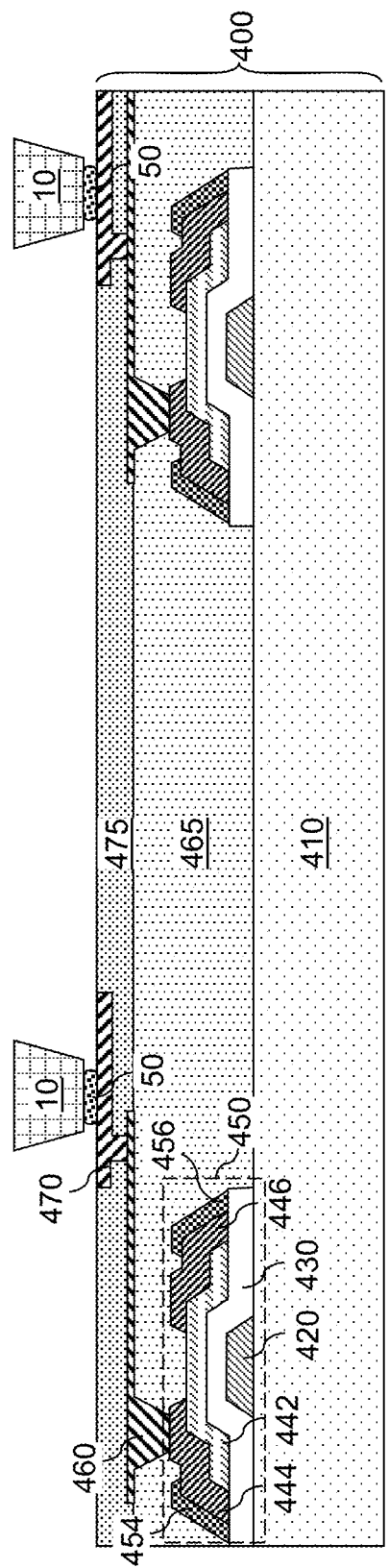
FIG. 1A is a vertical cross-sectional view of a first exemplary structure after forming an array of light emitting diodes on a backplane according to a first embodiment of the present disclosure.

As discussed above, the present disclosure is directed to light emitting diode arrays containing a micro lens array. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "layer" refers to a continuous portion of at least one material including a region having a thickness. A layer may consist of a single material portion having a homogeneous composition, or may include multiple material portions having different compositions.

Ranges can be expressed herein as from "about" one particular value, and/or to "about" another particular value. When such a range is expressed, examples include from the one particular value and/or to the other particular value. Similarly, when values are expressed as approximations, by use of the antecedent "about" or "substantially" it will be understood that the particular value forms another aspect. In some embodiments, a value of "about X" may include values of +/−1% X. It will be further understood that the endpoints of each of the ranges are significant both in relation to the other endpoint, and independently of the other endpoint.

As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "semiconducting material" refers to a material having electrical conductivity in the range from $1.0 \times 10^{-6}$ S/cm to $1.0 \times 10^5$ S/cm. As used herein, a "metallic material" refers to a conductive material including at least one metallic element therein. All measurements for electrical conductivities are made at the standard condition.

A display device, such as a direct view display can be formed from an ordered array of pixels. Each pixel can include a set of subpixels that emit light at a respective peak wavelength. For example, a pixel can include a red subpixel, a green subpixel, and a blue subpixel. Each subpixel can include one or more light emitting diodes that emit light of a particular wavelength. Each pixel is driven by a backplane circuit such that any combination of colors within a color gamut may be shown on the display for each pixel. The display panel can be formed by a process in which LED subpixels are soldered to, or otherwise electrically attached to, a bond pad located on a backplane. The bond pad is electrically driven by the backplane circuit and other driving electronics.

In the embodiments of the present disclosure, a method for fabrication of a multicolor (e.g., three or more color) direct view display may be performed by using light emitting devices which emit different color light in each pixel. In one embodiment, nanostructure (e.g., nanowire) or bulk (e.g., planar) LEDs may be used. Each LED may have a respective blue, green and red light emitting active region to form blue, green and red subpixels in each pixel. In another embodiment, a down converting element (e.g., red emitting phosphor, dye or quantum dots) can be formed over a blue or green light emitting LED to form a red emitting subpixel. In another embodiment, a blue or green light emitting nanowire LED in each subpixel is paired with a red emitting planar LED, such as an organic or inorganic red emitting planar LED to form a red emitting subpixel.

Figure 1B:
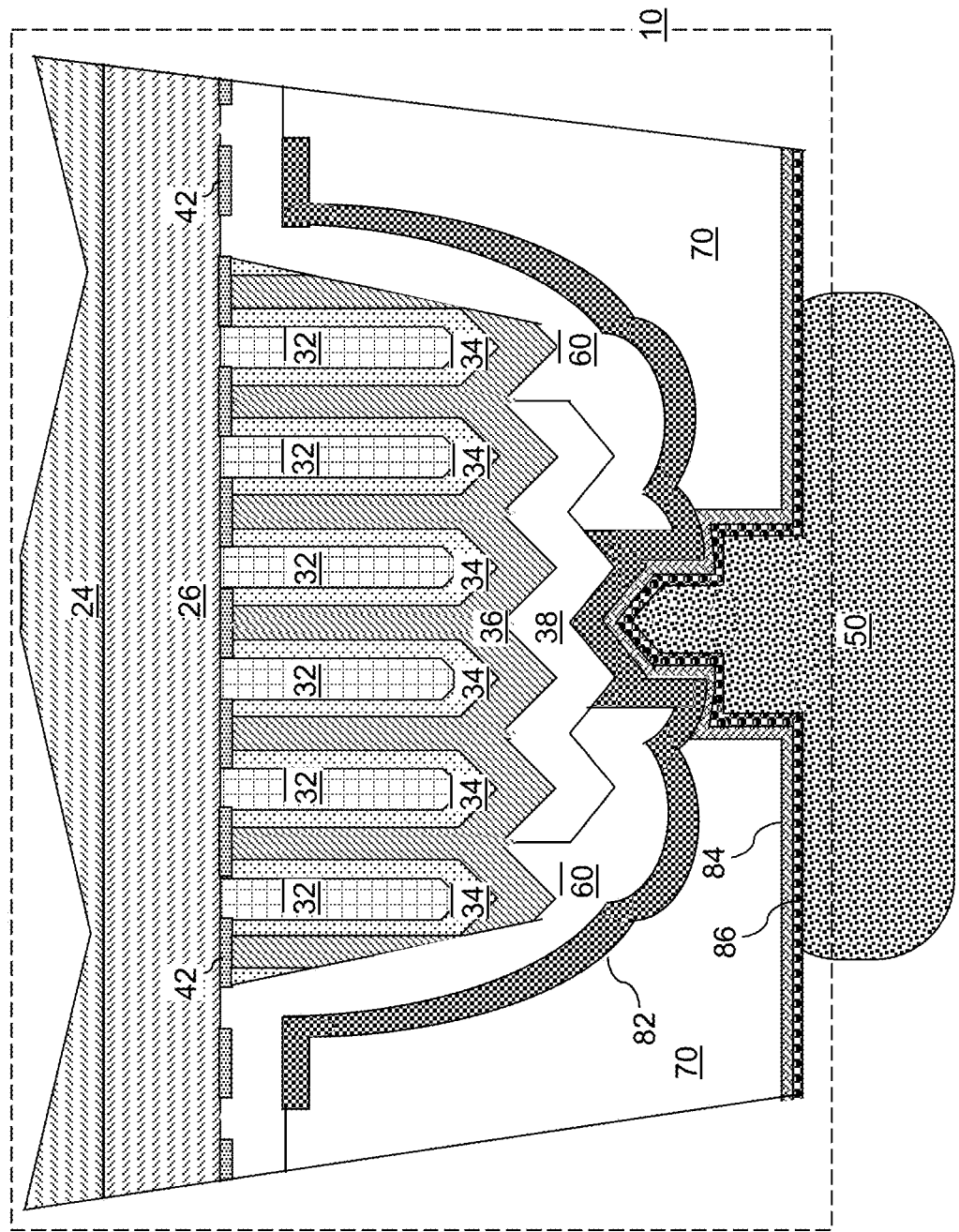
FIG. 1B is a magnified view of a region including a light emitting device within the structure of FIG. 1A.

Referring to FIGS. 1A and 1B, a first exemplary structure according to a first embodiment of the present disclosure includes a backplane 400 and an array of light emitting diodes 10 attached to a front side of the backplane 400 through an array of solder contacts, such as solder layer or solder balls 50. The backplane 400 includes a backplane substrate 410, which can be an insulating substrate. A control circuitry for controlling operation of the light emitting devices 10 attached to the backplane 400 may be provided within the backplane. For example, switching devices 450 can be provided within the backplane 400. In an illustrative example, the switching devices 450 can include field effect transistors, such as thin film transistors (TFTs). In this case, each field effect transistor 450 may include a gate electrode 420, a gate dielectric 430, a channel region 442, a source region 446, and a drain region 444. While an inverted staggered TFT 450 is shown in FIG. 1A, other types of TFTs, such as inverted coplanar, top gated staggered and top gated coplanar TFTs can be used instead. Various electrical wirings can be provided to interconnect the various electrical nodes of the field effect transistors to electrical interfaces (not expressly shown) on the backplane 400. Source interconnect wiring 456 and drain interconnect wiring 454 are illustrated. Additional interconnect wiring may be provided as needed. The switching devices 450 can be encapsulated by an encapsulation dielectric layer 465. First-level metal interconnect structures 460 can be formed through the encapsulation dielectric layer 465 to a node of a respective switching device 450 such as a drain region 444. An interconnect level dielectric layer 475 may be formed over the encapsulation dielectric layer 465, and second-level metal interconnect structures 470 can be formed through the interconnect level dielectric layer 475 on the first-level metal interconnect structures 460. The second-level metal interconnect structures 470 can include an array of bonding pads for attaching the array of light emitting diodes 10.

Each light emitting diode 10 can be any diode configured to emit light along a direction away from the backplane 400 and having at least one bonding pad facing the backplane 400. While an exemplary configuration of the nanowire based light emitting diodes 10 is illustrated in FIG. 1B, it is understood that other configurations for the light emitting diodes 10 can also be employed, such as for example planar LEDs or LEDs formed in semiconductor mesas. A light emitting diode 10 may be formed by sequentially depositing a buffer layer 24 and a doped compound semiconductor layer 26 (such as an n-doped GaN layer) having a doping of a first conductivity type on a transparent single crystalline substrate such as a sapphire substrate. A growth mask layer 42 with arrays of openings can be formed on top of the doped compound semiconductor layer 26. An array of nanowire cores 32 can be grown through the openings in the growth mask layer 42 by a selective epitaxial deposition process. Alternatively, nanopyramids may be grown in lieu of the nanowire cores 32. Methods for growing the nanowires cores 32 through the openings in the patterned growth mask layer 42 with substantially vertical sidewalls and faceted tip portion are described, for example, in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S. Pat. No. 8,309,439 to Seifert et al., which is assigned to QuNano AB, all of which are incorporated herein by reference in their entirety.

An active shell 34 is formed on each nanowires core 32. The active shell 34 includes at least one semiconductor material that emits light upon application of a suitable electrical bias. For example, each active shell 34 can include a single or a multi-quantum well (MQW) structure that emits light upon application of an electrical bias thereacross. For example, the quantum well(s) may comprise indium gallium nitride well(s) located between gallium nitride or aluminum gallium nitride barrier layers. Alternatively, the active shell 34 can include any other suitable semiconductor layers or stack of layers for light emitting diode applications provided that it can be grown on the surfaces of the nanowires cores 32. The set of all layers within an active shell 34 is herein referred to as an active layer. The active shell may emit any color light, such as blue, green or red light. Methods for growing the active shells 34 on the nanowires cores 32 are described, for example, in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S. Pat. No. 8,309,439 to Seifert et al., which is assigned to QuNano AB, all of which are incorporated herein by reference in their entirety. In an alternative embodiment, planar layers (32, 34) may be formed instead of the nanowire cores 32 and active region shells 34.

A second conductivity type semiconductor material layer 36 is formed on the sidewalls and faceted outer surfaces of the nanowires (32, 34). The second conductivity type semiconductor material layer 36 includes a doped semiconductor material having a doping of a second conductivity type, which is the opposite of the first conductivity type. For example, if the first conductivity type is n-type, then the second conductivity type is p-type. If the first conductivity type is p-type, then the second conductivity type is n-type.

The assembly of the second conductivity type semiconductor material layer 36 and the nanowire cores (32, 34) can be patterned to form discrete light emitting areas. An optional transparent conductive layer 38, such as a transparent conductive oxide layer, can be deposited and patterned over the horizontally extending portion of the second conductivity type semiconductor material layer 36. An optional dielectric material layer 60 may be deposited over the transparent conductive oxide layer 38 and the second conductivity type semiconductor material layer 36. The dielectric material layer 60 includes a transparent dielectric material such as silicon oxide, silicon nitride, a dielectric metal oxide (such as aluminum oxide), organosilicate glass, or porous variants thereof. An opening can be formed through the dielectric material layer 60 in each region that overlies a respective cluster of nanowires (32, 34). A conductive reflector 82 can be formed over each cluster of nanowires (32, 34) and on a respective one of the transparent conducive layers 38 or a respective one of the second conductivity type semiconductor material layers 36 by depositing a conductive reflector layer and patterning the conductive reflector layer (e.g., Al and/or Ag reflector layer (s)). An insulating cap layer 70 can be formed over the conductive reflectors 82. An opening can be formed through each area of the insulating cap layer 70 that overlies a respective conductive reflector 82, and bonding pad layers (84, 86) can be formed in the openings and over the insulating cap layer 70. The bonding pad layers (84, 86), the insulating cap layer 70, the dielectric material layer 60, the growth mask layer 42, the doped compound semiconductor layer 26, and the buffer layer 24 can be patterned to form trenches that isolate each cluster of nanowires (32, 34) from other clusters of nanowires (32, 34).

Each laterally isolated portion of the structure overlying the transparent single crystalline substrate constitutes a light emitting diode 10. Solder balls 50 can be attached to each device-side bonding pad, which is a patterned portion of the bonding pad layers (84, 86). The assembly of the transparent single crystalline substrate and an array of light emitting diodes attached thereto is flipped upside down, and is disposed over the backplane 400. Each solder ball 50 on a light emitting diode 10 that needs to be attached to the backplane 400 can be reflowed so that an overlying light emitting diode 10 is bonded to the backplane. The reflow may be conducted by heating the solder balls by irradiating by an infrared laser beam through the backplane 400 or through the LEDs 10 onto the solder balls 50 or by annealing the device in a furnace or similar heating apparatus above the solder ball 50 melting temperature. Solder balls 50 that underlie light emitting diodes that need not be transferred are not irradiated by the infrared laser beam or have a composition with a higher melting point than the furnace anneal temperature.

Portions of the buffer layer 24 that overlie attached light emitting diodes 10 are sequentially irradiated by a high power laser beam, such as an ultraviolet or visible light laser beam, through the transparent single crystalline substrate. Thus, each light emitting diode 10 that is soldered to the backplane 400 can be detached from the transparent single crystalline substrate by laser irradiation. The first exemplary structure of FIGS. 1A and 1B can be thus provided.

Figure 2A:
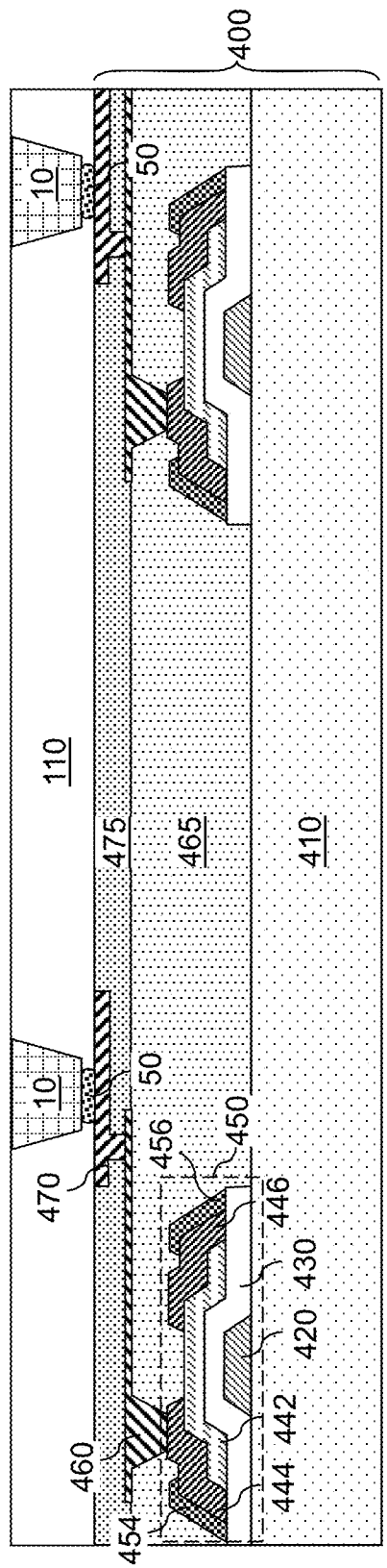
FIG. 2A is a vertical cross-sectional view of the first exemplary structure after depositing and planarizing a dielectric matrix layer according to the first embodiment of the present disclosure.
Figure 2B:
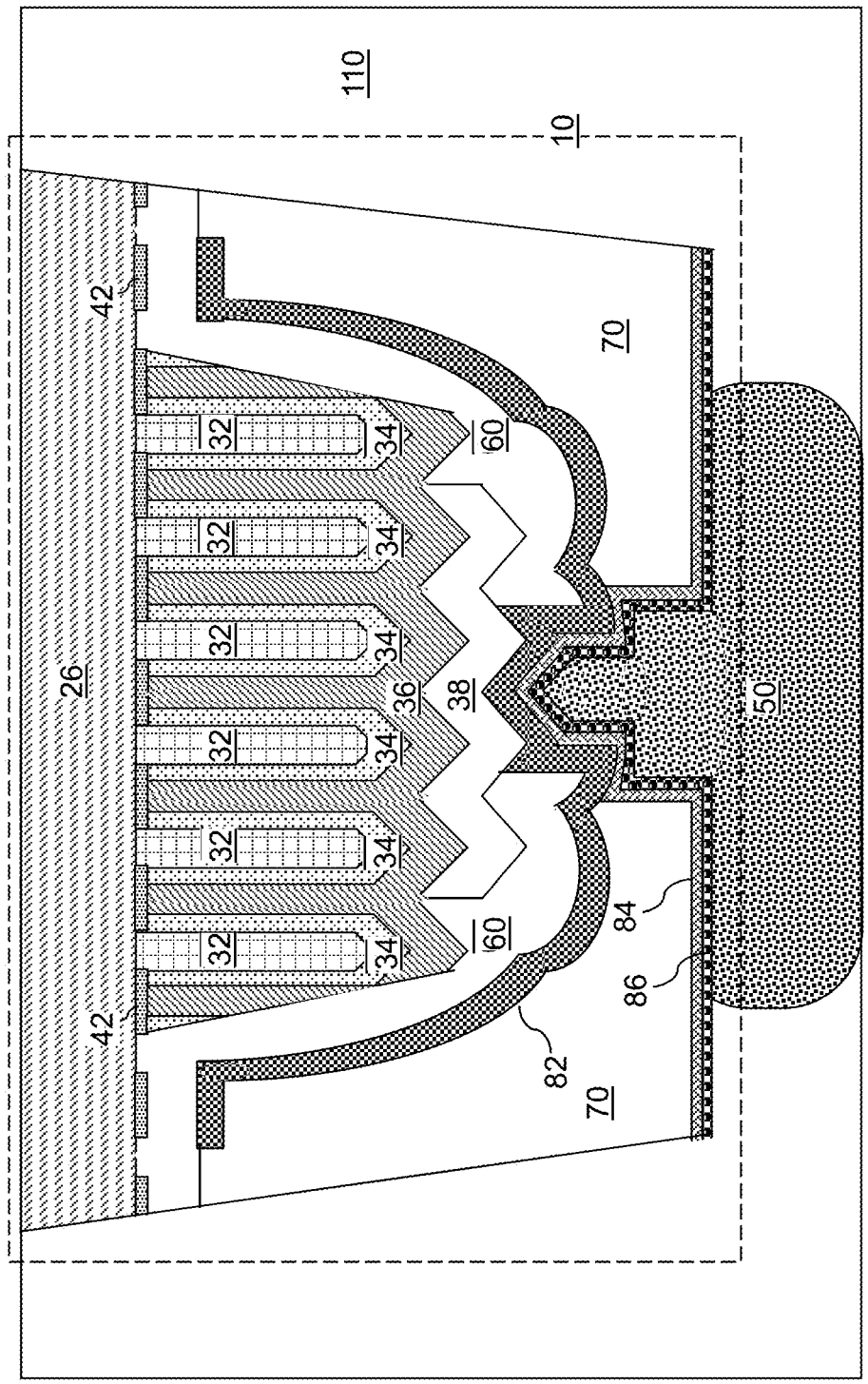
FIG. 2B is a magnified view of a region including a light emitting device within the structure of FIG. 2A.

Referring to FIGS. 2A and 2B, a planarizable dielectric material layer is deposited over the backplane 400 between the array of light emitting diodes 10. The planarizable dielectric material layer can be a silicon oxide-based material such as undoped silicate glass, a doped silicate glass (such as borosilicate glass, phosphosilicate glass, or borophosphosilicate glass), or a flowable oxide (FOX)), silicone, or an organic material such as resin. The planarizable dielectric material can be deposited by spin coating or chemical vapor deposition (such as sub-atmospheric chemical vapor deposition or plasma enhanced chemical vapor deposition).

The planarizable dielectric material is either self-planarized if deposited by spin coating or can be subsequently planarized, for example, by chemical mechanical planarization (CMP). If any portion of the buffer layer 24 is present in the light emitting diodes, the remaining portions of the buffer layer 24 can be removed during the planarization process so that top surfaces of the doped compound semiconductor layer 26 are physically exposed after the planarization process. The remaining continuous portion of the planarizable dielectric material layer is herein referred to as a dielectric matrix layer 110. The dielectric matrix layer 110 embeds the array of light emitting diodes 10. The top surface of the dielectric matrix layer 110 can be coplanar with the top surfaces of the light emitting diodes 10. The dielectric matrix layer 110 is located on the front side of the backplane 400, and laterally surrounds the array of light emitting diodes 10.

Figure 3B:
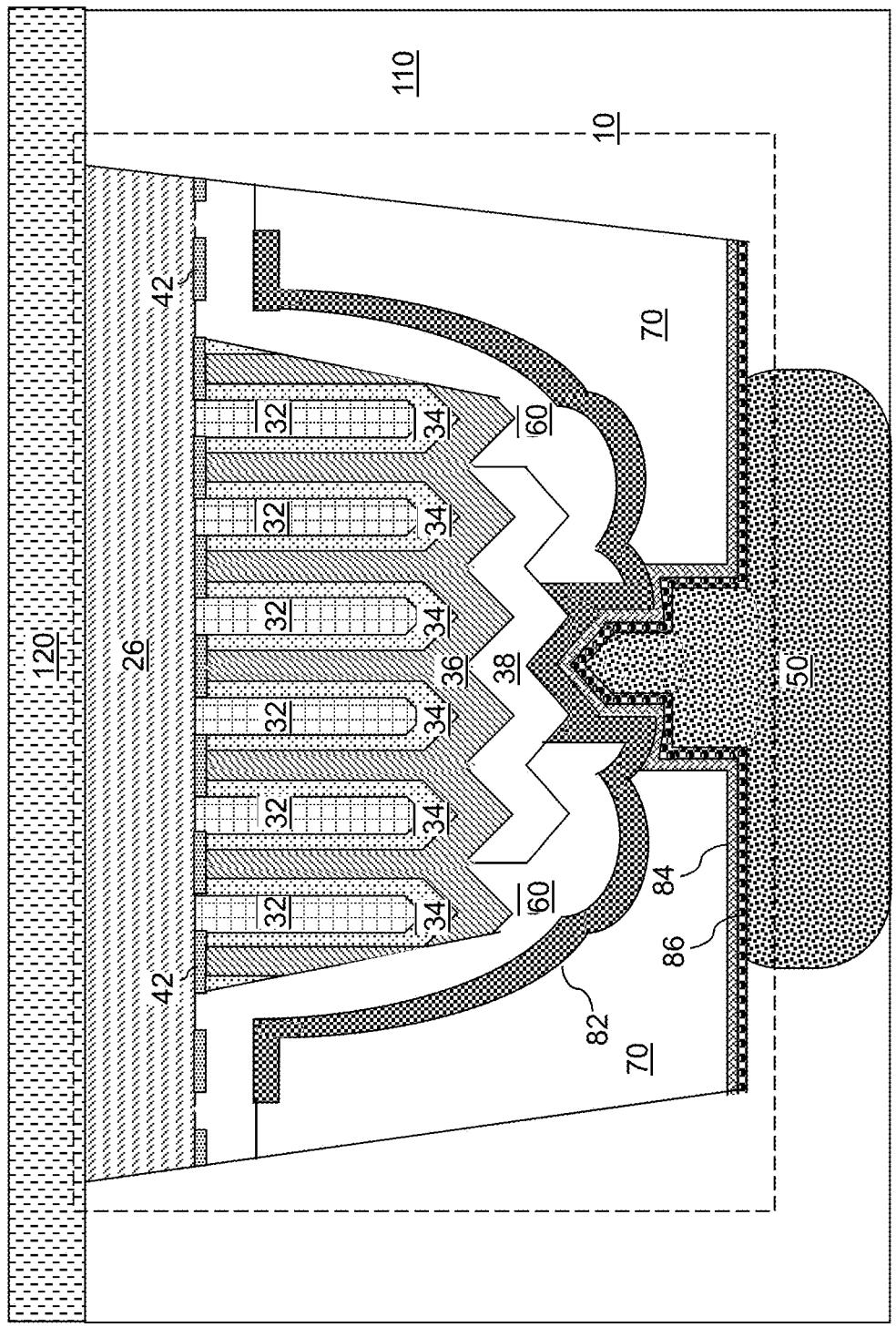
FIG. 3B is a magnified view of a region including a light emitting device within the structure of FIG. 3A.

Referring to FIGS. 3A and 3B, a transparent conductive layer 120 can be formed directly on the top surfaces, i.e., the front surfaces, of the light emitting diodes 10. The transparent conductive layer 120 can include a transparent conductive material such as indium tin oxide or aluminum doped zinc oxide. The transparent conductive layer 120 can be deposited as a continuous material layer that extends across the entire area of the array of light emitting diodes 10. The thickness of the transparent conductive layer 120 can be in a range from 20 nm to 600 nm, such as from 100 nm to 300 nm, although lesser and greater thicknesses can also be employed. The transparent conductive layer 120 can function as a common electrode (such as a cathode) of the array of light emitting diodes 10. The transparent conductive layer 120 forms a part of a bus electrode for the device.

Figure 4A:
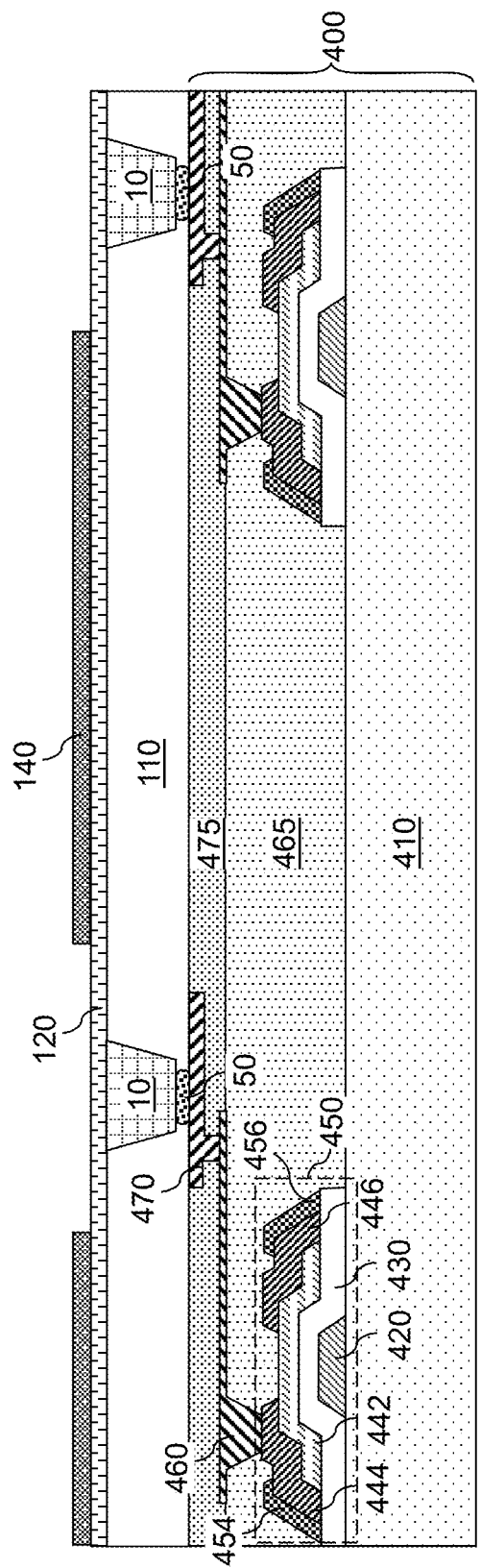
FIG. 4A is a vertical cross-sectional view of the first exemplary structure after formation of a patterned light-absorptive conductive layer as a patterned bus electrode layer according to the first embodiment of the present disclosure.
Figure 4B:
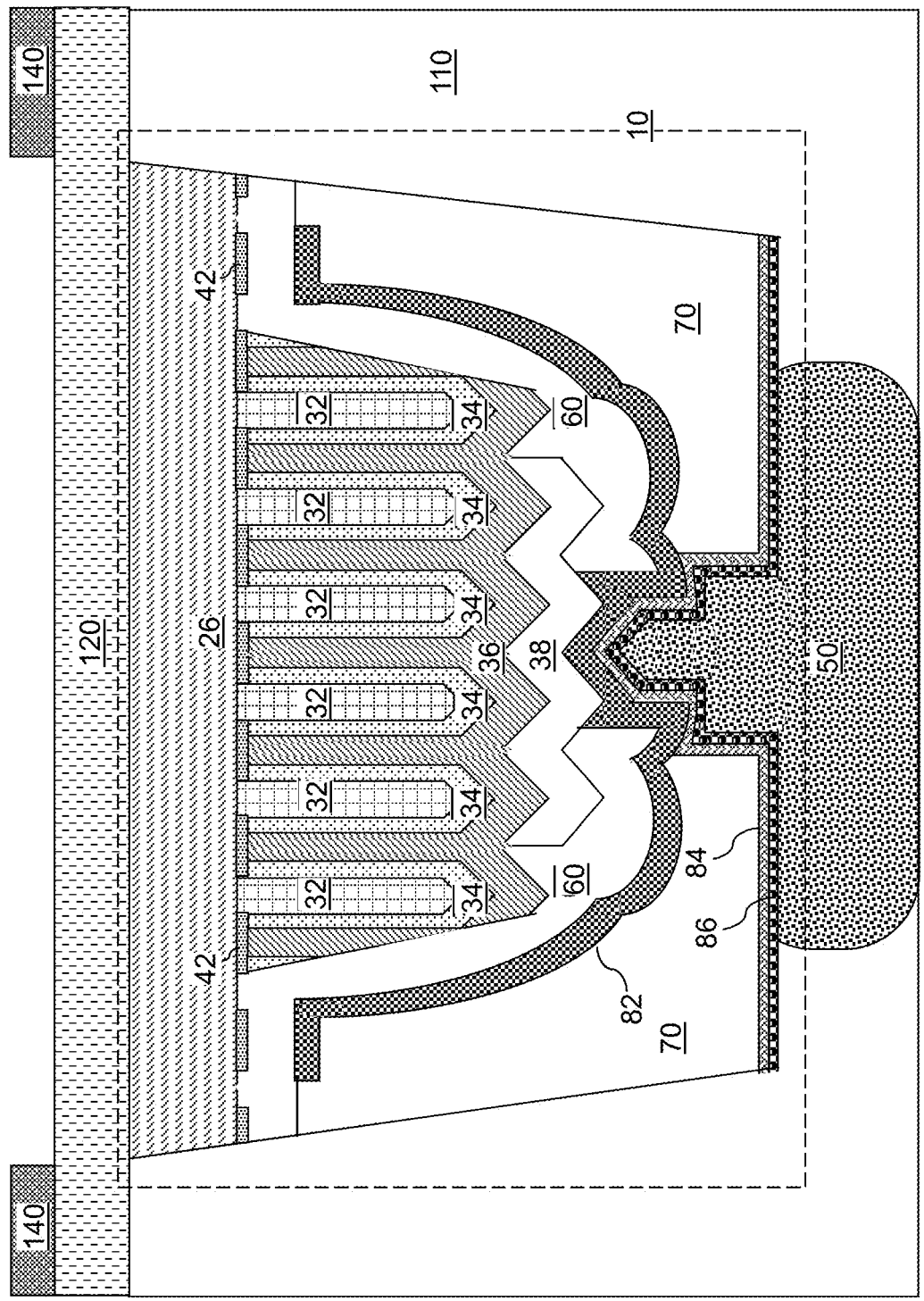
FIG. 4B is a magnified view of a region including a light emitting device within the structure of FIG. 4A.

Referring to FIGS. 4A and 4B, a black matrix 140 is formed over the top surface of the transparent conductive layer 120 by deposition and patterning of at least one material layer. The black matrix 140 has a higher absorptivity than the transparent conductive layer 120. As used herein, a "black matrix" may be a light-absorptive conductive layer that includes at least one conductive material and that absorbs more than 90% of visible light (i.e., radiation having a wavelength between 400 nm and 800 nm). As used herein, light absorption or light reflection is measured by a percentage of an incident light energy that is absorbed or reflected for the wavelength range from 400 nm to 800 nm, i.e., only within the visible spectrum. Each of the at least one conductive material has electrical conductivity greater than $1.0 \times 10^5$ S/cm. The black matrix 140 may include a single material layer providing electrical conductivity greater than $1.0 \times 10^5$ S/cm and providing absorption of more than 90%, and/or more than 95%, of visible light, or may include multiple material layers such that one or more of the material layers provide electrical conductivity greater than $1.0 \times 10^5$ S/cm, and one or more different material layers provide absorption of more than 90%, and/or more than 95%, of visible light. The light-absorptive conductive layer 140 is more electrically conductive than the transparent conductive layer 120. For example, the black matrix 140 has an electrical conductivity that is at least 25% higher, such as 50% to 300% than that of the transparent conductive layer 120.

For example, the at least one material layer can be deposited over the transparent conductive layer 120, and a photoresist layer can be applied over the at least one material layer. The photoresist layer can be lithographically patterned by lithographic exposure and development, and an etch process can be performed to etch the materials of the at least one material layer employing the patterned photoresist layer as an etch mask. The etch chemistry can be selected to etch the material(s) of the at least one material layer of the light-absorptive conductive layer 140. If the at least one material layer comprises multiple material layers, the multiple material layers may be sequentially etched employing a series of different etch chemistries. The etch process can form an array of openings through the at least one material layer. The patterned black matrix 140 is a patterned bus electrode layer, which forms part of the bus electrode that functions as a common electrode for each light emitting diode 10 within the array of light emitting diodes 10. The photoresist layer can be subsequently removed, for example, by ashing. The bus electrode comprises a combination of the light-absorptive conductive layer 140 and the transparent conductive layer 120.

FIGS. 5A-5D illustrate first through fourth layouts for the array of light emitting diodes 10 and the black matrix 140, i.e., the patterned bus electrode layer. The black matrix 140 is electrically shorted to the transparent conductive layer 120 and includes an array of openings therein. Each light emitting diode 10 within the array of light emitting diodes 10 can be located within an area of a respective opening through the black matrix 140. In one embodiment, a periphery of each opening within the black matrix 140 can be laterally offset outward from a periphery of a respective light emitting diode 10 that is laterally enclosed therein.

Generally, the black matrix 140 of embodiments of the present disclosure can reduce reflectance from incoming ambient light to increase the contrast ratio and compensate for the higher resistance of the transparent conductive layer 120 which reduces or prevents an IR drop. The shapes of openings in the black matrix 140 can be selected to expose only a single light emitting diode 10 (as in the configurations of FIGS. 5A and 5C), or to expose a row of light emitting diodes 10 (as in the configuration of FIGS. 5B and 5D). Alternatively, the shapes of openings in the black matrix can be selected to expose a group of light emitting diodes 10 that constitutes a single pixel, which can include a set of subpixels emitting light at different peak wavelengths. The black matrix 140 comprises at least one conductive material layer and provides a higher light absorption than top surfaces of the light emitting diodes 10.

Figure 5B:
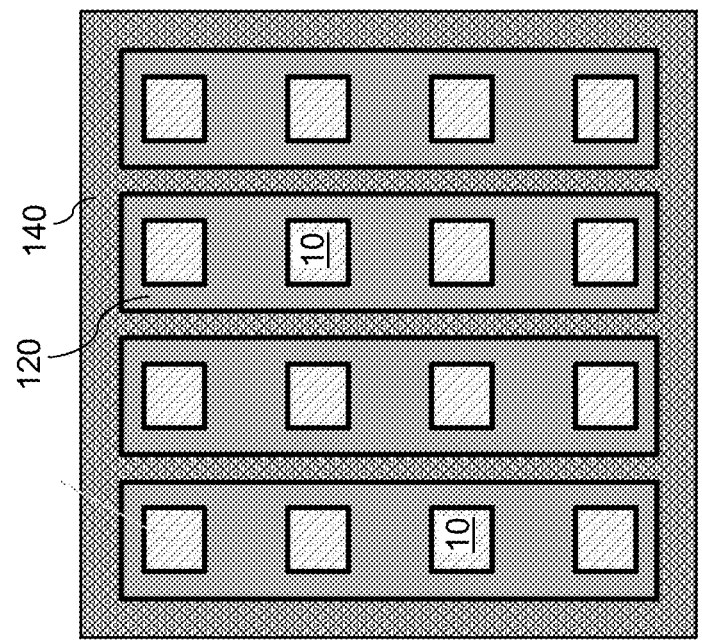
FIG. 5B is a plan view of a second layout for the first exemplary structure according to the first embodiment of the present disclosure.
Figure 5A:
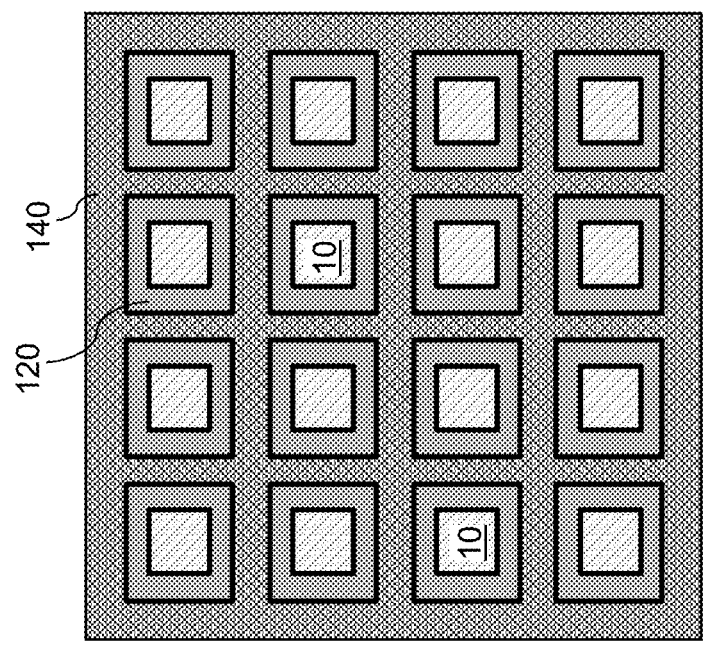
FIG. 5A is a plan view of a first layout for the first exemplary structure according to the first embodiment of the present disclosure.
Figure 5D:
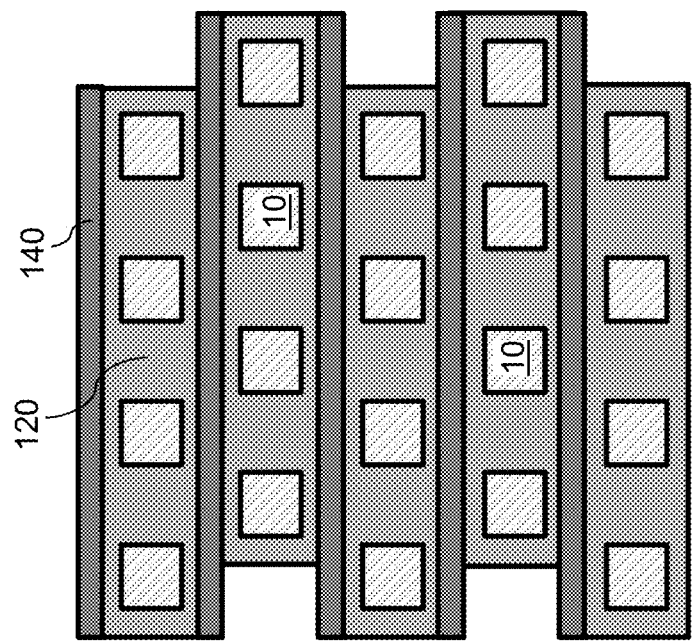
FIG. 5D is a plan view of a fourth layout for the first exemplary structure according to the first embodiment of the present disclosure.
Figure 5C:
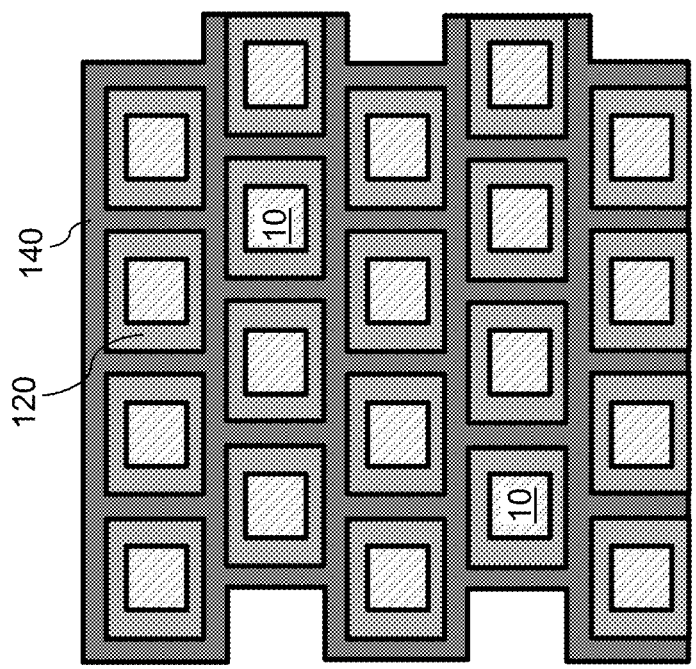
FIG. 5C is a plan view of a third layout for the first exemplary structure according to the first embodiment of the present disclosure.

The LEDs 10 may be arranged in a rectangular grid of rows and columns as shown in FIGS. 5A and 5B, or the LEDs 10 may have a staggered configuration in which the LEDs are arranged in row or column direction but are offset from each other in the other one of the column or row direction, as shown in FIGS. 5C and 5D.

Various layer stacks may be employed for the at least one material layer that constitutes the black matrix 140. For example, in some embodiments, the black matrix 140 may be formed of multiple layers, such as a metal layer, a buffer layer, phase matching layer, and/or a metallic light-absorptive layer including a conductive metallic material having a higher light absorption of the visible light than the metal layer.

Figure 6A:
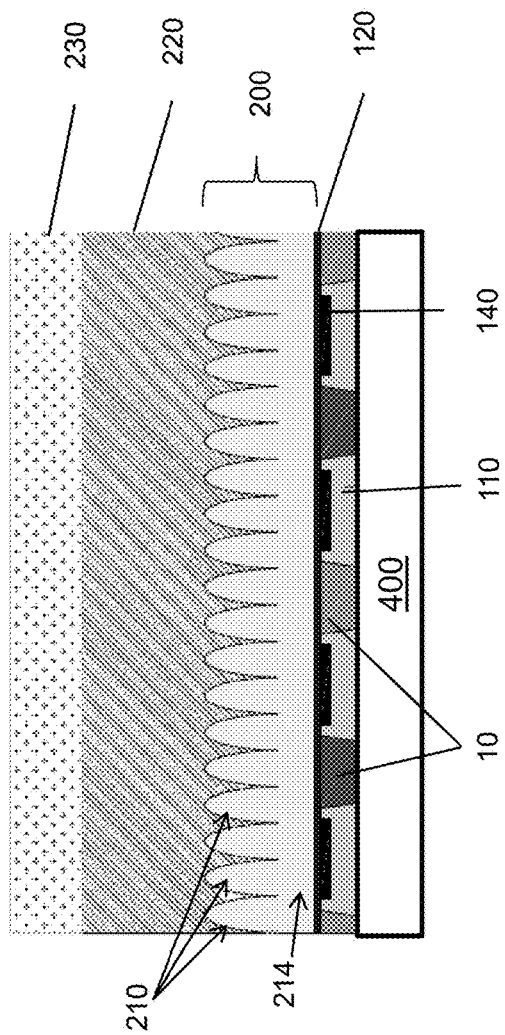
FIG. 6A is a vertical cross-sectional view of a light emitting device, according to various embodiments of the present disclosure.
Figure 6B:
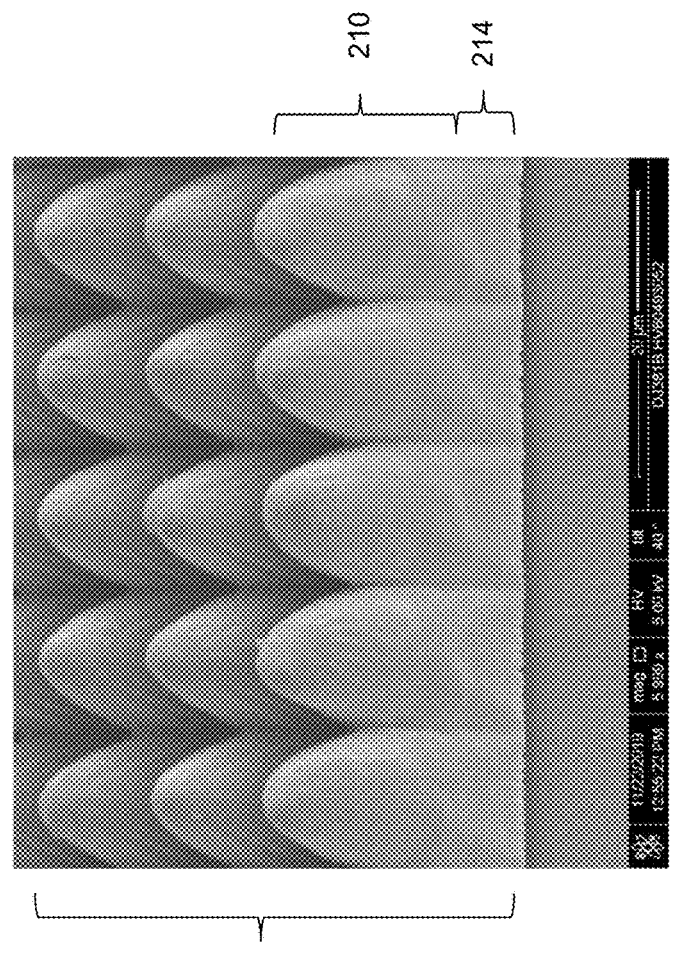
FIG. 6B is a micrograph of a micro lens array (MLA) that may be included in the device of FIG. 6A.

FIG. 6A is a sectional view of a display device, according to various embodiments of the present disclosure, and FIG. 6B is micrograph of a micro lens array (MLA) 200 that may be included in the device of FIG. 6A. Referring to FIG. 6A, the device may include an array of LEDs 10 arrayed on a backplane 400. The LEDs 10 may be disposed within a dielectric matrix layer 110 configured to planarize the backplane 400.

A black matrix 140 may be disposed on the dielectric matrix layer 110 and may include openings exposing the LEDs 10. A transparent conductive layer 120 may be disposed on the LEDs 10 and the black matrix 140. However, in other embodiments, the black matrix 140 may be disposed above the transparent conductive layer 120, rather than below the transparent conductive layer 120, as shown in FIG. 6A.

In various embodiments, an MLA 200 may be disposed on the transparent conductive layer 120. A low refractive index (RI) layer 220 may be optionally formed on the MLA 200. The low RI layer 220 may be formed of a material having a refractive index value n ranging from about 1.05 to about 1.3, such as from about 1.1 to about 1.2. For example, the low RI layer 220 may be formed of a polymer such as ILE-500 series high RI encapsulants available from Inkron Co. A cover glass 230 may be optionally disposed on the low RI layer 220. The cover glass 230 may be formed of any suitable glass material and may include touch screen-type functionality.

Referring to FIGS. 6A and 6B, the MLA 200 may be formed of a patterned, optically transparent material, such as glass or polymer (i.e., plastic) material. The MLA may include an array of unit lenses 210 that are configured to focus light received from respective ones of the LEDs 10. For example, the unit lenses 210 may each be aspheric and may possess rotational symmetry.

In some embodiments, the unit lenses 210 may be formed by selectively etching a transparent material using any suitable selective etching process. In some embodiments, the etching process may not completely etch through the transparent layer, and the MLA 200 may include an optically transparent, continuous common base 214 upon which the unit lenses 210 are disposed. The base 214 may be configured to collect light emitted from a corresponding LED and transmit the collected light to the corresponding unit lenses 210 disposed thereon.

Figure 7A:
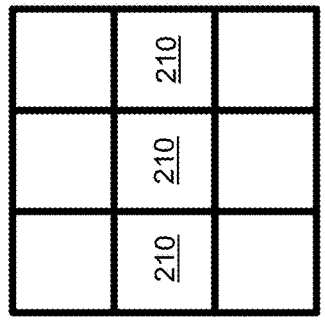
FIGS. 7A-7C are top schematic views showing different unit lens packing configurations that may be utilized in an MLA, according to various embodiments of the present disclosure.
Figure 7B:
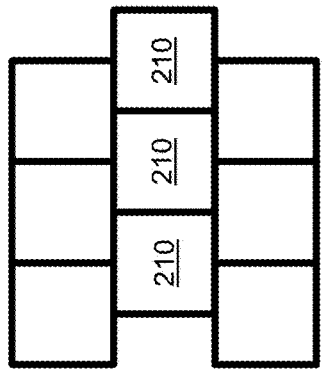
Figure 7C:
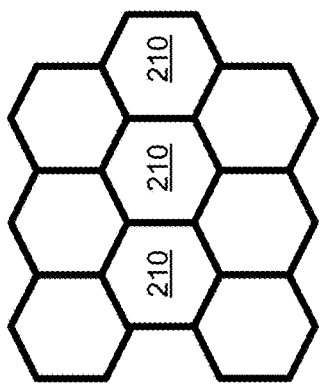

FIGS. 7A-7C are top schematic views showing different unit lens packing configurations that may be utilized in an MLA 200. Referring to FIGS. 7A-7C, the unit lenses 210 may be arrayed in any suitable geometry. For example, the unit lenses 210 may be arranged in a rectangular matrix or grid of aligned columns and rows (FIG. 7A). In other embodiments the unit lenses 210 may be arranged in a rectangular matrix or grid including offset rows or columns (FIG. 7B). In other embodiments, the unit lenses 210 may be arranged in a substantially hexagonal matrix having a honeycomb pattern (FIG. 7C). However, the present disclosure is not limited to any particular base shape or unit lens arrangement.

Figure 8A:
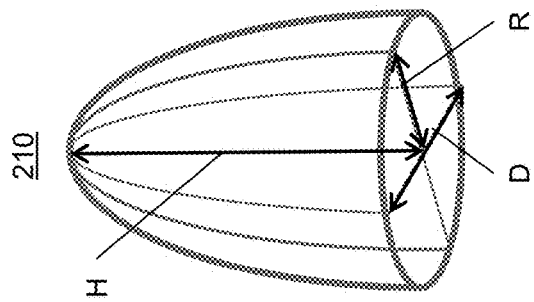
FIG. 8A is a schematic view of a unit lens, according to various embodiments of the present disclosure.
Figure 8B:
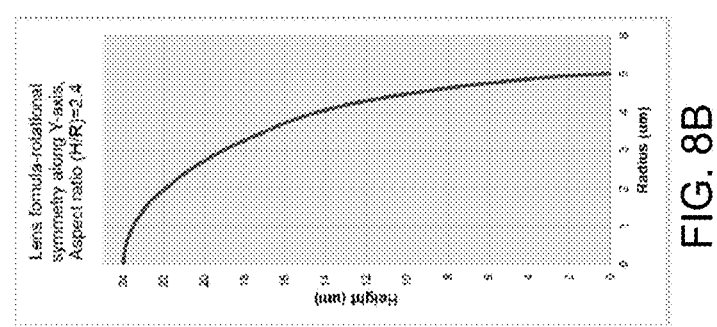
FIG. 8B is a graph show a suitable aspect ratio for the unit lens of FIG. 8A.

FIG. 8A is a schematic view of a unit lens 210, according to various embodiments of the present disclosure, and FIG. 8B is a graph show a suitable aspect ratio for the unit lens 210 of FIG. 8A. Referring to FIGS. 8A and 8B, the radius R of the unit lens 210 may decrease as the height H of the unit lens 210 increases. The height H may be measured alone a rotational axis of the unit lens 210. For example, the maximum radius R at the base (e.g., at height H of zero) may be less than 50 μm, such as from about 2.5 to about 10 μm, such as from about 4 to about 8 μm, or about 5 to about 6 μm. An aspect ratio of height H to maximum radium R of the unit lens 210 may range from about 2.2 to about 2.6, such as from about 2.3 to about 2.5, or may be about 2.4, in some embodiments.

In some embodiments, a maximum diameter D of the unit lens 210 may be set to be smaller than the maximum lateral widths of the respective LEDs 10, such as the lateral width of a top surface of the LEDs 10 which face the MLA 200. It should be noted that the above statement does not exclude some unit lenses 210 which may have the same or larger a maximum diameter than the maximum lateral widths of the respective LEDs 10. Herein, the maximum diameter D may refer to a diameter taken at a height H of zero. For example, the maximum diameter D may range from about 5 to about 20 µm, such as from about 8 to about 16 µm, or about 10 to about 12 µm. The LEDs 10 may be micro LEDs which have the maximum lateral width of 100 µm or less, such as about 10 to about 50 µm, such as from about 15 to about 30 µm, or about 20 to about 25 µm.

Figure 9:
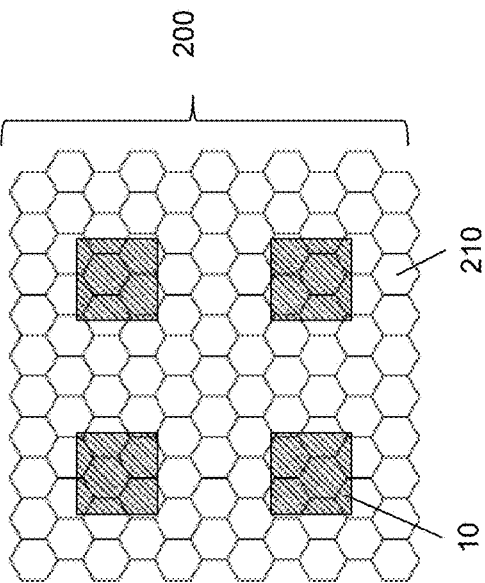
FIG. 9 is a top view showing the relative locations of an MLA and LEDs that may be utilized in the display device of FIG. 6A, according to various embodiments of the present disclosure.

FIG. 9 is a top view showing the relative locations of an MLA 200 and LEDs 10 that may be utilized in the display device of FIG. 6A, according to various embodiments of the present disclosure. Referring to FIGS. 6A, 8A, and 9, the MLA 200 may include a honeycomb array of unit lenses 210. The unit lenses 210 may have a maximum lateral cross-sectional area that is smaller than the maximum lateral surface area of each LED 10. Herein, the "maximum cross-sectional area" may refer to the area of a cross-section a unit lens 210 taken at a height H of zero. For example, the maximum cross-sectional area each unit lens 210 may be less than half of the surface area of each LED 10, such as from about ⅕ to about ½ of the surface area of each LED 10. In addition, a distance between adjacent LEDs 10 may be greater than the maximum diameter D of each unit lens 210. While a honeycomb array of unit lenses 210 located over LEDs 10 having a rectangular top surface is shown in FIG. 9, other configurations may be used, such as a grid array of unit lenses 210 and/or LEDs 10 having a circular, oval or other polygonal (e.g., hexagonal, etc.) top surface.

Accordingly, each unit lens 210 may overlap with no more than one LED 10, in a vertical direction taken perpendicular to a front side of the backplane 400. In addition, each LED 10 may be vertically overlapped by multiple unit lenses 210. In other words, each unit lens 210 may be configured to focus light emitted from a single LED 10, while light from each LED 10 is focused by multiple unit lenses 210. As such, lens misalignment, where a single unit lens focuses light emitted from different LEDs 10, or where no unit lens or only part of a unit lens is located over a respective LED 10, may be reduced or prevented.

FIG. 10 is a schematic view of an MLA 300, according to various embodiments of the present disclosure. Referring to FIG. 10, the MLA 300 includes unit lenses 210 arranged in a pseudo-random pattern. In particular, unit lenses 210 having different sizes may be arranged in a random or substantially random pattern to form a sub-array 302. The unit lenses 210 may each be smaller than a corresponding LED. Multiple sub-arrays 302 may be stitched together to form the MLA 300. The MLA 300 may be substituted for the MLA 200 in the display device of FIG. 6A. In the configuration shown in FIG. 10, the MLA 200 comprises unit lenses 210 of multiple different sizes. Alternatively, the MLA 200 shown in FIG. 6A or in FIG. 10 may comprise unit lenses 210 having the same sizes (i.e., uniformly sized unit lenses 210).

The various exemplary structures of the present disclosure prevent emission of light, partly or completely, from areas between neighboring pairs of light emitting diodes, and thus, enhance the sharpness of images formed by the array of light emitting diodes. Embodiments that employ a light-absorptive layer provide a darker non-reflective background surface for the array of light emitting diodes, thereby enhancing the contrast of the images formed by the array of light emitting diodes. In addition, various embodiments employ an MLA that is configured to focus light from individual LEDs, in order to reduce or prevent misalignment of unit lenses and corresponding LEDs. Thus, the various embodiments of the present disclosure can be advantageously employed to provide image enhancement in a light emitting device, such as a direct view display device in which the LED 10 light is directly viewed by a human observer without an intervening liquid crystal layer.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:

1. A light emitting device, comprising:
a backplane;
light emitting diodes (LEDs) attached to a front side of the backplane;
a micro lens array (MLA) located over the LEDs, the MLA comprising unit lenses that have a smaller maximum diameter than a maximum lateral width of the respective LEDs; and
a black matrix including openings which expose the LEDs,
wherein each LED is located entirely below an area of a respective opening in the black matrix, and
wherein the black matrix comprises a light-absorptive conductive material that forms a patterned bus electrode layer, which forms a part of a bus electrode that functions as a common electrode for the LEDs.

2. The light emitting device of claim 1, further comprising:
a dielectric matrix layer located on the front side of the backplane and laterally surrounding the array of light emitting diodes; and
a transparent conductive layer contacting front surfaces of the light emitting diodes,
wherein:
the black matrix is disposed on the transparent conductive layer or on the dielectric matrix layer;
the black matrix is electrically shorted to the transparent conductive layer;
the black matrix comprises at least one material layer providing electrical conductivity greater than $1.0 \times 10^5$ S/cm and providing absorption of more than 90% of visible light; and
the black matrix has an electrical conductivity that is at least 25% higher than that of the transparent conductive layer.

3. The light emitting device of claim 2, wherein each unit lens is configured to focus light emitted from no more than one of the LEDs through a corresponding one of the openings in the black matrix.

4. The light emitting device of claim 3, wherein each LED is overlapped by at least two of the unit lenses in a vertical direction perpendicular to the front side the backplane, and maximum lateral widths of the respective LEDs are 100 microns or less.

5. The light emitting device of claim 1, wherein the unit lenses are disposed in a grid pattern having aligned columns and rows.

6. The light emitting device of claim 1, wherein the unit lenses are disposed in a grid pattern having offset columns or rows.

7. The light emitting device of claim 1, wherein the unit lenses are disposed in a honeycomb pattern.

8. The light emitting device of claim 1, wherein the unit lenses are arranged in a random or pseudo random pattern.

9. The light emitting device of claim 8, wherein the MLA comprises the unit lenses of multiple different sizes.

10. The light emitting device of claim 1, wherein the MLA comprises the unit lenses having the same sizes.

11. The light emitting device of claim 1, wherein the unit lenses are aspheric having a decreasing radius with increasing height.

12. The light emitting device of claim 11, wherein the unit lenses have an aspect ratio of height to maximum radius ranging from about 2.2 to about 2.6.

13. The light emitting device of claim 1, wherein the MLA is formed by etching a transparent layer.

14. The light emitting device of claim 13, wherein the MLA comprises a transparent common base layer upon which the unit lenses are disposed.

15. The light emitting device of claim 1, wherein the LEDs are spaced apart by a distance greater than a maximum diameter of the unit lenses.

16. The light emitting device of claim 1, further comprising a low refractive index layer disposed on the MLA and having a refractive index ranging from about 1 to about 1.3.

17. The light emitting device of claim 16, wherein the low refractive index layer comprises a polymer.

18. The light emitting device of claim 16, further comprising a cover glass disposed on the low refractive index layer.

19. The light emitting device of claim 18, wherein the cover glass has touch-screen functionality.

20. The light emitting device of claim 1, wherein the light emitting device is a direct view display device.

21. The light emitting device of claim 1, wherein a periphery of each opening within the black matrix is laterally offset outward from a periphery of a respective light emitting diode that is laterally enclosed therein.

22. The light emitting device of claim 1, wherein a width of each LED is less than a width of the respective opening.

23. The light emitting device of claim 1, wherein a length of each LED is less than a length of the respective opening.

24. The light emitting device of claim 1, wherein a shape of the respective opening exposes only a single LED.

25. The light emitting device of claim 1, wherein a shape of the respective opening exposes a plurality of LEDs.

26. The light emitting device of claim 25, wherein the plurality of LEDs corresponds to a single pixel comprising subpixels emitting light at different peak wavelengths.

27. A light emitting device, comprising:
a backplane;
light emitting diodes (LEDs) attached to a front side of the backplane;
a micro lens array (MLA) located over the LEDs, the MLA comprising unit lenses that have a smaller maximum diameter than a maximum lateral width of the respective LEDs;
a dielectric matrix layer located on the front side of the backplane and laterally surrounding the array of light emitting diodes;
a transparent conductive layer contacting front surfaces of the light emitting diodes; and
a black matrix disposed on the transparent conductive layer or on the dielectric matrix layer, and including openings which expose the LEDs,
wherein each unit lens is configured to focus light emitted from no more than one of the LEDs through a corresponding one of the openings in the black matrix, and
wherein the black matrix comprises a light-absorptive conductive material that forms a patterned bus electrode layer, which forms a part of a bus electrode that functions as a common electrode for the LEDs.

* * * * *